United States Patent
Hartke et al.

(10) Patent No.: US 9,651,017 B2
(45) Date of Patent: May 16, 2017

(54) LASER IGNITION DEVICE FOR AN INTERNAL COMBUSTION ENGINE AND OPERATING METHOD THEREFOR

(75) Inventors: Rene Hartke, Stuttgart (DE); Heiko Ridderbusch, Schwieberdingen (DE)

(73) Assignee: Robert Bosch GmbH, Stuttgart (DE)

( * ) Notice: Subject to any disclaimer, the term of this patent is extended or adjusted under 35 U.S.C. 154(b) by 412 days.

(21) Appl. No.: 13/879,569

(22) PCT Filed: Sep. 8, 2011

(86) PCT No.: PCT/EP2011/065572
§ 371 (c)(1),
(2), (4) Date: Jun. 20, 2013

(87) PCT Pub. No.: WO2012/048965
PCT Pub. Date: Apr. 19, 2012

(65) Prior Publication Data
US 2013/0255613 A1    Oct. 3, 2013

(30) Foreign Application Priority Data

Oct. 14, 2010   (DE) ........................ 10 2010 042 453

(51) Int. Cl.
*F02B 19/00* (2006.01)
*H01S 3/11* (2006.01)
(Continued)

(52) U.S. Cl.
CPC ............ *F02P 23/04* (2013.01); *H01S 3/0627* (2013.01); *H01S 3/09415* (2013.01);
(Continued)

(58) Field of Classification Search
CPC . F02P 23/04; F02P 9/007; H01T 13/50; H01S 3/113; H01S 3/115; H01S 3/117
(Continued)

(56) References Cited

U.S. PATENT DOCUMENTS 7,810,462 B2 * 10/2010 Herden ................... F02P 23/04
                                                           123/143 B
2006/0139714 A1 *  6/2006 Gruhlke ............. G02B 26/0833
                                                            359/204.1
(Continued)

FOREIGN PATENT DOCUMENTS

DE    10 2007 040 119     2/2009
DE    10 2009 029 096     4/2010
(Continued)

OTHER PUBLICATIONS

WO95/28756, PCT/US95/04864, Steven Macomber, Curved Grating Surface-Emitting Distributed Feedback Laser, Oct. 26, 1995.*
(Continued)

*Primary Examiner* — Carlos A Rivera
*Assistant Examiner* — Syed O Hasan
(74) *Attorney, Agent, or Firm* — Norton Rose Fulbright US LLP; Gerard A. Messina

(57) ABSTRACT

A laser ignition device for an internal combustion engine, having a laser device, which has a laser-active solid body and a passive Q-switch, and having a pump light source for optically pumping the laser device. The pump light source has a plurality of surface-emitting semiconductor lasers.

14 Claims, 7 Drawing Sheets

(51) Int. Cl.
*F02P 23/04* (2006.01)
*H01S 3/06* (2006.01)
*H01S 5/183* (2006.01)
 *H01S 3/094* (2006.01)
 *H01S 3/0941* (2006.01)
 *H01S 3/113* (2006.01)
 *H01S 5/42* (2006.01)

(52) U.S. Cl.
 CPC ............ *H01S 5/183* (2013.01); *H01S 3/0941* (2013.01); *H01S 3/09408* (2013.01); *H01S 3/094053* (2013.01); *H01S 3/094057* (2013.01); *H01S 3/113* (2013.01); *H01S 5/423* (2013.01)

(58) Field of Classification Search
 USPC .......................................... 123/143 B; 372/10
 See application file for complete search history.

(56) References Cited

U.S. PATENT DOCUMENTS

| | | | | |
|---|---|---|---|---|
| 2009/0133655 A1* | 5/2009 | Inohara | .................. | F02P 23/04 123/143 B |
| 2009/0159032 A1* | 6/2009 | Gruber | .................. | F02P 23/04 123/143 B |

FOREIGN PATENT DOCUMENTS

| | | | |
|---|---|---|---|
| JP | 7-58379 | | 3/1995 |
| JP | 10-261825 | | 9/1998 |
| JP | 11-312834 | | 11/1999 |
| WO | WO95/28756 | * | 10/1995 |
| WO | WO 95/28756 | | 10/1995 |
| WO | WO 2005/066488 | | 7/2005 |
| WO | WO2005066488 | * | 7/2005 |
| WO | WO 2007/071794 | | 6/2007 |

OTHER PUBLICATIONS

International Search Report, PCT International Application No. PCT/EP2011/065572, dated Nov. 11, 2011.

* cited by examiner

LASER IGNITION DEVICE FOR AN INTERNAL COMBUSTION ENGINE AND OPERATING METHOD THEREFOR

BACKGROUND INFORMATION

The present invention relates to a laser ignition device for an internal combustion engine, having a laser-active solid body and a preferably passive laser device, which has a Q-switch, and having a pump light source for the optical pumping of the laser device. The present invention also relates to a method for operating such a laser ignition device.

SUMMARY

An object of the present invention to provide an improved laser ignition device and an improved operating method.

In accordance with the present invention, the laser ignition device has a pump light source having a plurality of surface-emitting semiconductor lasers. The use according to an example embodiment of the present invention of surface-emitting semiconductor lasers (vertical cavity surface emitting laser, VCSEL) offers advantages for the operation of a laser ignition device. The lower temperature sensitivity in comparison to solid-state lasers advantageously also allows the use of VCSEL laser sources in direct proximity to the internal combustion engine, so that there is no necessity of situating the pump light source at a distance from the internal combustion engine. With use of the VCSEL, simple air cooling is typically sufficient, so that water cooling, as has heretofore been provided for use of semiconductor lasers operated in the area of the internal combustion engine, may be omitted.

Furthermore, simple regulation of the temperature on the semiconductor laser is made possible due to the low temperature sensitivity of the wavelength generated by a VCSEL laser of approximately 0.06 nm/K (nanometers per degree Kelvin).

The robustness of VCSEL laser sources additionally allows a simpler construction of laser spark plugs in particular, which typically accommodate components of a laser-based ignition device for an internal combustion engine. Cross-section converters in the laser spark plug may especially be omitted; the use of elements for eliminating feedback effects is also not necessary. Such elements are typically to be provided in standard laser ignition systems having solid-state lasers to reduce the feedback of the high-energy laser ignition pulses on conventional pump light sources.

The line width of VCSEL arrays is typically less than the line width of edge-emitting lasers or other semiconductor lasers. Particularly efficient absorption of the pump radiation generated by the pump light source in the pumped solid-state laser material may thus be ensured.

VCSEL arrays are particularly preferably constructed from a very large number of individual surface-emitting laser emitters, so that through a corresponding combination of serial and parallel electrical interconnection, a nominal operating current and a nominal operating voltage may be adapted to different operating conditions of the internal combustion engine or a control unit for the laser ignition device. In particular, measures for the electromagnetic compatibility in the area of the internal combustion engine may thus also be assisted, which may occur due to the comparatively high current strengths, which are switched at comparatively high frequencies. Through an individual electrical interconnection of many individual VCSEL emitters, the pump light source may be adapted very easily to an electrical power supply for the VCSEL laser source.

In addition, the output power of VCSEL arrays is scalable via the emission surface, so that even without large design changes to a construction of the laser ignition device, the energy of the laser ignition pulses may be varied, specifically by the design of a pump light source having a corresponding output power.

Another advantage of VCSEL arrays in the case of the use in a laser ignition device is that through the geometrically simple pump arrangement, additional sensors may easily be positioned in a pump module having the pump light source.

In an advantageous specific embodiment, a light-conducting device is provided, via which the pump radiation generated by the pump light source may be radiated into the laser device. The light-conducting device preferably has a generally conical, prismatic, cuboid, cylindrical, or pyramidal shape, a coupling surface, through which pump radiation generated by the pump light source is coupled into the light-conducting device being preferably arranged approximately parallel to a decoupling surface, which forms the cover surface of a corresponding truncated cone in the case of the design of a conical shape, for example.

Through the slight divergence of VCSEL arrays in the pump light source and the nearly arbitrary shape of the surface emitting the pump light or the pump radiation, symmetrical light-conducting devices having a comparatively small construction may preferably be used.

In another preferred specific embodiment, the light-conducting device is at least partially formed from glass and/or crystalline and/or ceramic material. In particular a high index of refraction and good processing capability are advantageous. The geometry of the light conductor is preferably adapted to the divergence of the surface-emitting semiconductor laser of the pump light source, so that the condition of total reflection on the lateral surfaces of the light-conducting device is met for the entire generated pump radiation. The length of the light-conducting device may be adapted, for example, by the desired degree of reduction of the emission surface.

In another preferred specific embodiment, it is provided that the light-conducting device contacts the pump light source and/or the laser device directly or with the aid of a contact medium, for example, an index matching gel, whereby particularly efficient coupling of the pump radiation into the laser device or the laser-active solid body of the laser device is provided.

A direct contact may be produced, for example, by gluing or wringing together. These specific embodiments of the present invention have a particularly high robustness against misalignment of the components (pump light source, light conductor, laser device) and low coupling losses.

Alternatively or additionally, a beam-shaping optical system may be introduced between the light-conducting device and the laser device. In addition to the coupling of the pump radiation directly into the laser device, using the light-conducting device according to the present invention, the pump radiation may also be coupled into a light-conducting fiber.

In another advantageous specific embodiment, it is provided that the pump light source has a plurality of surface-emitting semiconductor lasers situated spatially separated from one another, in particular groups of semiconductor lasers, and pump radiation generated by the groups of semiconductor lasers may be radiated directly or via focusing optics into the laser device. Pump volumes separated from one another may thus be implemented particularly advantageously in the laser device or in its laser-active solid body, so that advantageously multiple laser pulses may be generated simultaneously. The individual pump volumes to which pump radiation is applied operate independently of one another as laser resonators.

In another preferred specific embodiment, it is provided that the pump light source has multiple pump light units, a first pump light unit being situated and designed in such a way that it may longitudinally pump the laser device, and at least one further pump light unit being designed and situated in such a way that it may transversely pump the laser device.

The transverse pumping advantageously ensures particularly simple energy introduction of pump energy into the laser medium, i.e., the laser-active solid body, and the longitudinal pump radiation causes the implementation of a laser mode in the laser-active solid body with good beam quality.

Particularly efficient coupling of the pump radiation to be transversely supplied into the laser device results according to another specific embodiment if the pump light units provided for the transverse optical pumping each have a generally strip-shaped, planar arrangement, which extends generally parallel to a longitudinal axis of a laser device. In addition, at least one pump light unit provided for the transverse optical pumping may be assigned a cylinder lens for bundling the pump radiation into the laser device.

An example method according to an embodiment of the present invention provides that the pump light source has a plurality of surface-emitting semiconductor lasers (VCSEL), which optically pump the laser device.

In one preferred specific embodiment of the operating method according to the present invention, it is provided that pump light is applied to different volume areas of the laser device or the laser-active solid body separately from one another. Multiple laser pulses may thus particularly preferably be generated generally simultaneously.

In another advantageous specific embodiment, it is provided that the laser device is longitudinally pumped with the aid of a first pump light unit, and the laser device is transversely pumped with the aid of at least one further pump light unit.

The first pump light unit particularly preferably generates pump radiation having a generally circular beam cross section, which is used for the longitudinal pumping of the laser device, whereby a laser mode of particularly good beam quality results.

Further features, possible applications, and advantages of the present invention result from the following description of exemplary embodiments of the present invention, which are shown in the figures. All features which are described or shown form the object of the present invention alone or in arbitrary combination, independently of their wording or representation in the description or in the figures, respectively.

BRIEF DESCRIPTION OF THE DRAWINGS

FIG. 7b schematically shows a top view of the specific embodiment according to FIG. 7a.

DETAILED DESCRIPTION OF EXAMPLE EMBODIMENTS

Figure 1:
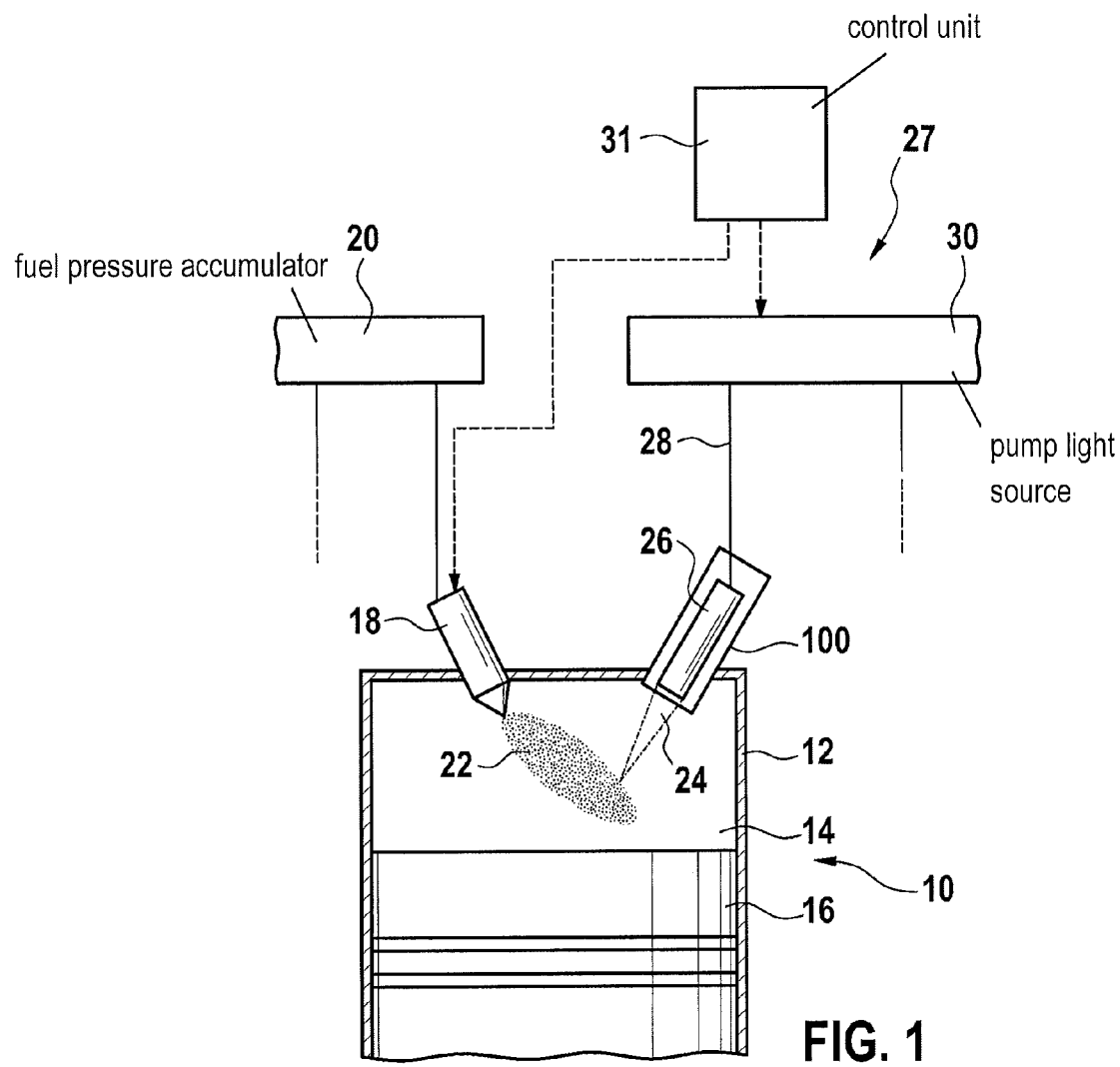
FIG. 1 shows an internal combustion engine having a laser-based ignition system according to an example embodiment of the present invention.

An internal combustion engine bears reference numeral 10 as a whole in FIG. 1. It is used to drive a motor vehicle (not shown) or for power generation in stationary operation. Internal combustion engine 10 includes multiple cylinders, only one of which is identified by reference numeral 12 in FIG. 1. A combustion chamber 14 of cylinder 12 is delimited by a piston 16. Fuel reaches combustion chamber 14 directly through an injector 18, which is connected to a fuel pressure accumulator 20, also referred to as a rail.

Fuel 22 injected into combustion chamber 14 is ignited with the aid of a laser beam 24, which is preferably emitted into combustion chamber 14 in the form of a laser pulse 24 from a laser spark plug 100 having a laser device 26. For this purpose, laser device 26 is supplied with a pump light, which is provided by a pump light source 30, via a light-conducting device 28. Pump light source 30 is controlled by a control unit 31, which also activates injector 18.

Pump light source 30 forms, together with light-conducting device 28 and laser spark plug 100, which has laser device 26, a laser-based ignition system 27 of internal combustion engine 10.

Figure 2:
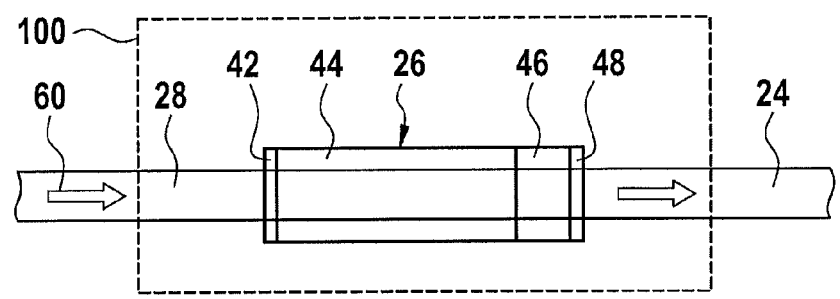
FIG. 2 schematically shows a first specific embodiment of a laser spark plug from FIG. 1 in detail.

As is apparent from FIG. 2, in addition to a laser-active solid body 44, according to the present invention, laser device 26 also has a passive Q-switch 46, so that components 44, 46 form a laser oscillator together with a coupling mirror 42 and a decoupling mirror 48.

The fundamental mode of operation of laser device 26 is as follows: Pump light 60, which is supplied to laser device 26 via a light-conducting device 28, passes through coupling mirror 42, which is transmissive for a wavelength of pump light 60, into laser-active solid body 44. Pump light 60 is absorbed there, which results in a population inversion. The initially high transmission losses of passive Q-switch 46 prevent laser oscillation in laser device 26. However, with increasing pump duration, the radiation density also increases in the interior of the resonator formed by laser-active solid body 44 and passive Q-switch 46 and mirrors 42, 48. From a specific radiation density, passive Q-switch 46 or an absorber, which may be saturated, of passive Q-switch 46 bleaches out, so that a laser oscillation occurs in the resonator.

Through this mechanism, a laser beam 24 in the form of a so-called giant pulse is generated, which passes through decoupling mirror 48 and is subsequently referred to as a laser ignition pulse.

Instead of above-described passive Q-switch 46, the use of an active Q-switch is also possible.

According to an example embodiment of the present invention, pump light source 30 has a plurality of surface-emitting semiconductor lasers, which are also referred to as vertical cavity surface emitting lasers (VCSEL).

Figure 3:
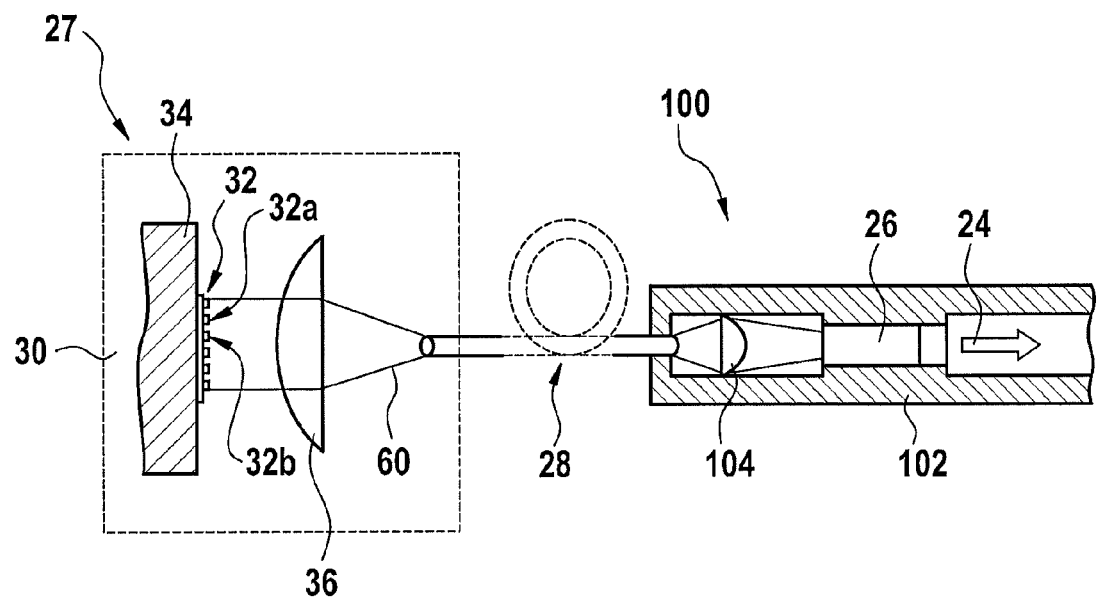
FIG. 3 shows a specific embodiment of a laser-based ignition system having a pump light source situated at a distance.

FIG. 3 schematically shows a side view of a laser ignition device 27, as has already been schematically indicated by FIG. 1.

A laser spark plug 100 has a laser device 26, which is situated in spark plug housing 102, and which is designed according to FIG. 2, for example, and is used to generate laser pulses 24. Laser spark plug 100 is assigned a pump light source 30, which has multiple VCSEL laser sources, therefore at least one so-called VCSEL array 32, individual surface-emitting semiconductor lasers 32a, 32b, ... of the VCSEL array being situated on a shared heat sink 34.

A focusing optical system 36 is situated optically downstream from VCSEL array 32, which bundles pump radiation 60 generated by the VCSEL array onto a coupling-in surface (not identified in FIG. 3) of light-conducting device 28. Via a light-conducting device 28, pump radiation 60 is supplied to laser spark plug 100. In laser spark plug 100, pump radiation 60 supplied from light-conducting device 28 is shaped again, in the present case by focusing optics 104, which bundles pump radiation 60, which exits at a certain divergence angle from light-conducting device 28, onto laser device 26 or laser-active solid body 44 of laser device 26.

VCSEL array 32 is preferably a so-called high-powered VCSEL array, which is installed in a conventional way on heat sink 34 and is electrically contacted in such a way that it may be supplied with energy via activation lines (not shown) to control the generation of pump radiation 60.

A focusing lens 36, which is designed as a simple compressed optical system, may be used for coupling pump radiation 60 into light-conducting device 28.

According to a further advantageous specific embodiment, microlenses (not shown) may also be assigned to the individual laser emitters of VCSEL array 32, which greatly reduce the divergence of pump radiation 60.

Figure 4:
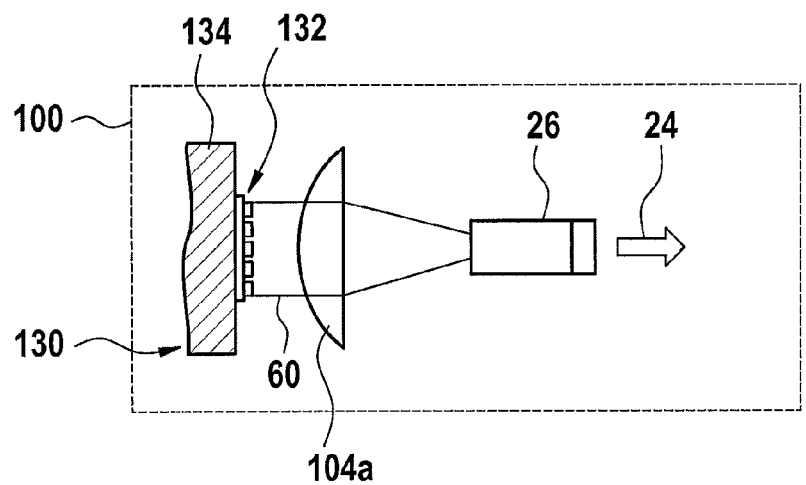
FIG. 4 shows a specific embodiment of a laser ignition device having a pump light source integrated into a laser spark plug.

FIG. 4 schematically shows another arrangement of a laser ignition device, in which pump light source 130—in contrast to the specific embodiment according to FIG. 3—is integrated directly into laser spark plug 100. Therefore, in the example embodiment shown in FIG. 4, a separate light-conducting device 28 is not necessary; pump radiation 60 may rather be emitted directly from VCSEL array 132 via focusing optics 104a into laser device 26, which then generates a laser pulse 24 in the way already described. VCSEL array 132 is situated on a heat sink 134, which is preferably connected integrally or even in one piece to housing 102 (FIG. 3) of laser spark plug 100.

By omitting light-conducting device 28 and the pump light source situated (cf. specific embodiment according to FIG. 3) at a distance from laser spark plug 100, a particularly cost-effective configuration with reduced error susceptibility results in the specific embodiment according to FIG. 4.

In the present configurations described with reference to FIGS. 3, 4, transverse optical pumping may additionally be carried out, in which corresponding additional VCSEL arrays (not shown) are situated laterally to laser device 26.

Particularly advantageous wavelengths for the VCSEL array of pump light source 30, 130 are 806 nm, 885 nm, 914 nm, 946 nm, 975 nm, and 980 nm. Absorption lines of laser-active solid body 44 having a small width may also be used due to the small line width of VCSEL array 32, 132.

Thus, for example, the pumping of Nd:YAG at 885 nm is easier to implement than using conventional pump light sources, which have edge-emitting semiconductor lasers, for example.

Further, conventional laser techniques, for example, the use of an oscillator having an optical amplifier situated downstream or integrated into a resonator, are transferable to the pumping with the aid of VCSEL arrays 32, 132.

Figure 5A:
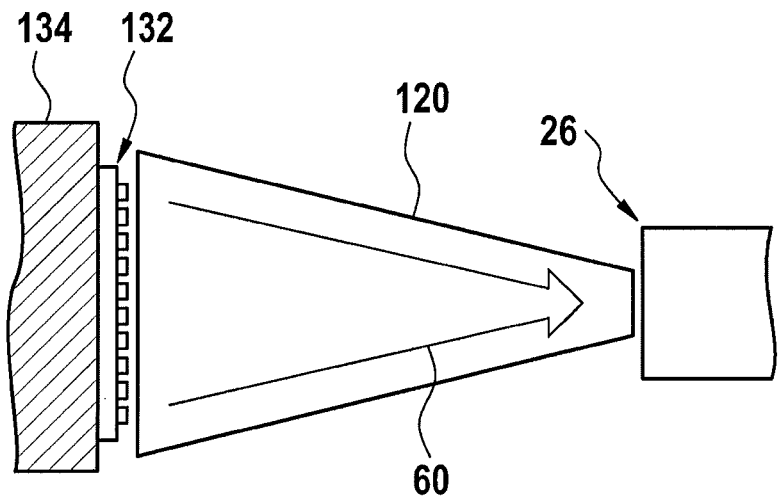
FIGS. 5a through 5d show other specific embodiments of the laser ignition device having a light-conducting device for coupling pump radiation into the laser device.

FIG. 5a schematically shows another specific embodiment of a laser ignition device, in which a VCSEL array 132 is again situated on a heat sink 134 and generates pump radiation 60 for radiation into a laser device 26. In the configuration according to FIG. 5a, a light-conducting device 120 is advantageously provided, which allows efficient radiation or conduction of pump radiation 60 from VCSEL array 132 to laser device 26. As is apparent from FIG. 5a, light-conducting device 120 preferably has the shape of a cone or truncated cone. Other shapes (prisms, cuboids, pyramids, cylinders) are also possible.

Light-conducting device 120 is particularly preferably positioned as close as possible in front of VCSEL array 132, to preferably collect all of pump radiation 60. Pump radiation 60 is condensed over the length of light-conducting device 120 extending in the horizontal direction in FIG. 5a and may thus be coupled into solid-state laser 26. Instead of the coupling into a solid-state laser or laser device 26, configuration 132, 120 may also be used for the purpose of coupling pump radiation 60 efficiently into a light-conducting device 28, as is used in the specific embodiment according to FIG. 3.

This means that in the specific embodiment according to FIG. 5a, pump radiation 60 may also be coupled into a light-conducting device 28 (FIG. 3) instead of directly into laser device 26. This is also true for the other specific embodiments having a light-conducting device described hereafter with reference to FIGS. 5b through 5d.

Figure 5B:
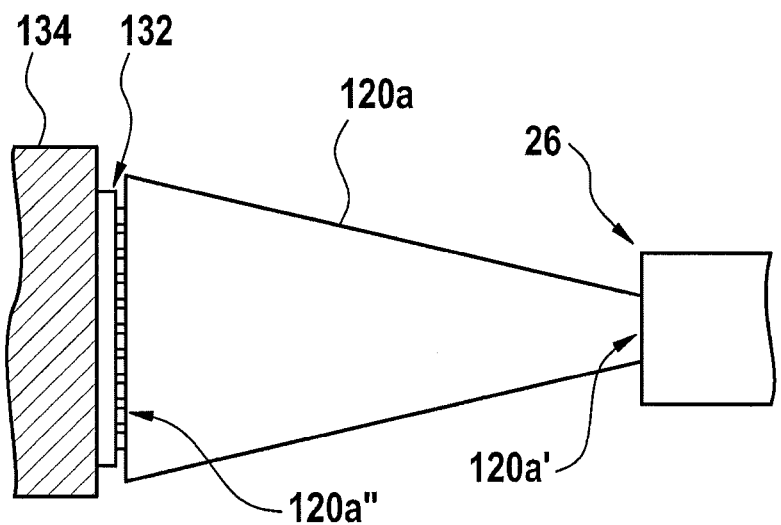

FIG. 5b schematically shows another specific embodiment of the laser ignition device, in which a light-conducting device 120a, which may be designed comparably to light-conducting device 120 of the specific embodiment according to FIG. 5a, is provided between VCSEL array 132 and laser device 26. In the specific embodiment shown in FIG. 5b, a coupling surface 120a" of light-conducting device 120a is in direct contact with an optical surface of VCSEL array 132, which causes particularly efficient coupling of pump radiation into light-conducting device 120a. Similarly thereto, decoupling surface 120a' of light-conducting device 120a is also in direct contact with a front face of laser device 26. The contacting of respective surfaces 120a', 120a" may be achieved, for example, by gluing, wringing together, bonding, or by the use of contact media, for example, an index matching gel. A particular advantage of this configuration is high robustness against misalignment and particularly low coupling losses.

Figure 5C:
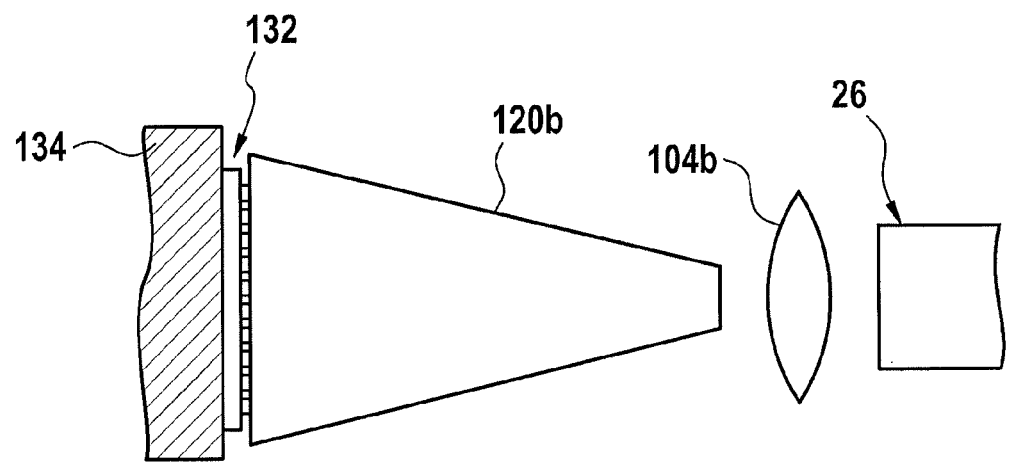

FIG. 5c shows another specific embodiment of the laser ignition device, in which a light-conducting device 120b is provided for conducting pump radiation 60. In addition to light-conducting device 120b, focusing optics 104b is provided, which is situated between light-conducting device 120b and laser device 26, and which bundles pump radiation (not shown) exiting from light-conducting device 120b onto laser device 26, in order to pump it longitudinally. Pump radiation 60 may be optimally formed by focusing optics 104b.

Figure 5D:
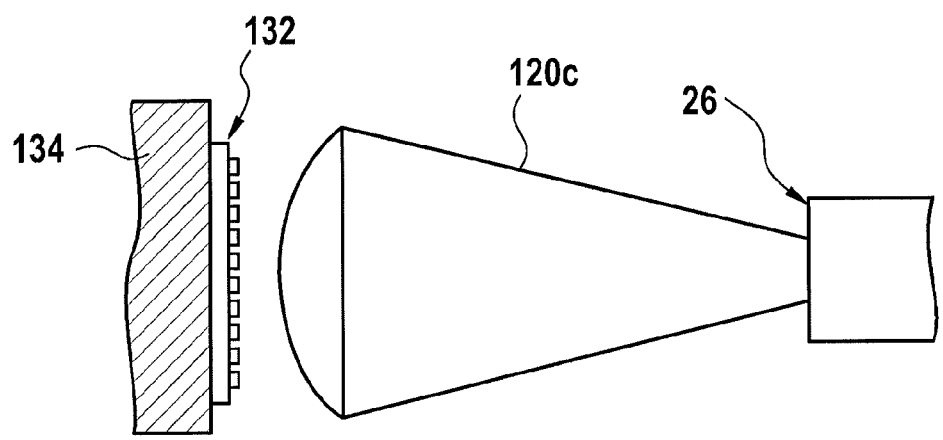

FIG. 5d shows another specific embodiment of a laser ignition device, in which the coupling surface of light-conducting device 120c is not designed as planar, but rather is curved, to increase a coupling efficiency of pump radiation from VCSEL array 132 into light-conducting device 120c. The length of light-conducting device 120c may be significantly reduced simultaneously due to the curved coupling surface. The curvature of the coupling surface may be achieved by polishing, for example, or also by attaching a lens element, which may be bonded onto an initially planar coupling surface of light-conducting element 120c, for example.

Figure 6A:
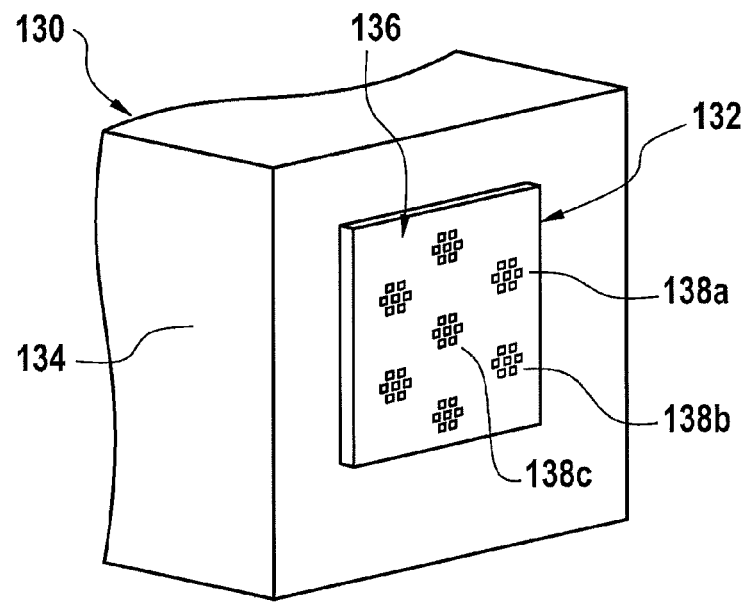
FIG. 6a shows another specific embodiment of a pump light source.

FIG. 6a schematically shows another specific embodiment of a pump light source 130, which may preferably be integrated into laser spark plug 100 (FIG. 2). Pump light source 130 has multiple groups 138a, 138b, 138c of VCSEL arrays, which are situated on a shared carrier arrangement 136. Carrier arrangement 136 is in turn situated on heat sink 134. The grouping of different VCSEL arrays 138a, 138b, 138c, . . . is preferably carried out in such a way that they are spatially separated far enough from one another that their different pump beams do not overlap. Different volume areas V1, V2, V3 of laser device 26 or laser-active solid body 44 may thus be optically pumped separately from one another, cf. the side view according to FIG. 6b in this regard.

Optionally, focusing optics 104a may be provided, which bundles pump light partial beams 60a, 60b, 60c in a suitable way onto desired volume elements V1, V2, V3.

Each group 138a, 138b, 138c of VCSEL arrays advantageously has a plurality of individual surface emitters, which are situated approximately in a circle, to allow the most round or circular pumping mode possible. Individual groups 138a, 138b, 138c are to have a sufficiently large output power to be able to generate a laser pulse 24a, 24b, 24c (FIG. 6b) in solid-state laser 44.

For optimized imaging of VCSEL array 132, it is advantageous if emitted radiation 60a, 60b, 60c is collimated by microlenses (not shown), which are preferably in turn situated directly on the individual VCSEL emitters.

Figure 6B:
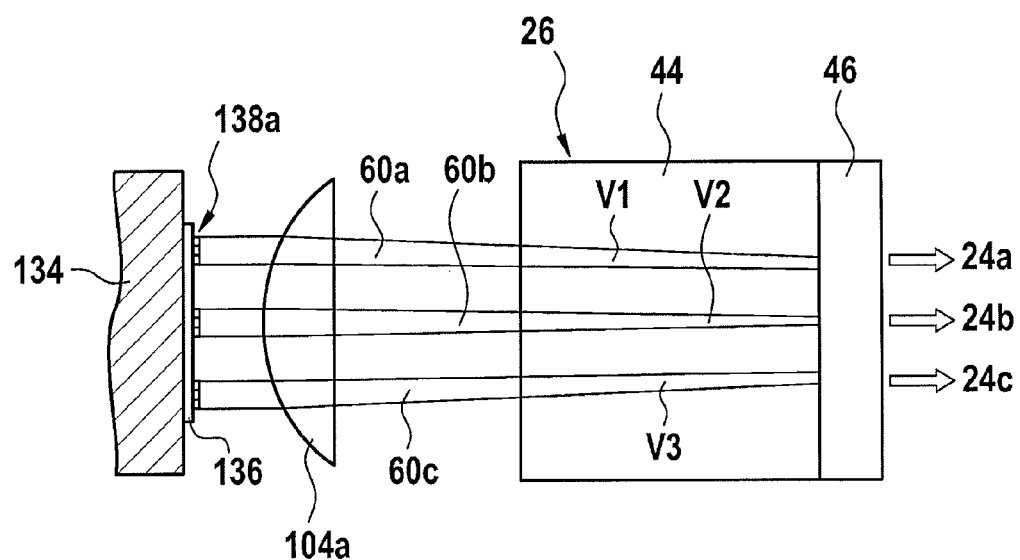
FIG. 6b schematically shows the application of pump light to a laser device by the pump light source according to FIG. 6a, FIG. 6c shows another specific embodiment of a pump light source according to the present invention.

FIG. 6b shows how individual laser pulses 24a, 24b, 24c arise spatially separated from one another, which results through individually pumped volume areas V1, V2, V3, which are spatially separate from one another. In order for all laser pulses 24a, 24b, 24c to be preferably emitted simultaneously, the electric activation of pump light source 130 may be carried out, for example, in such a way that several microseconds before the actual triggering of the laser pulses (bleaching of the absorber, which may be saturated, of passive Q-switch 46), the activation current of the VCSEL array is significantly increased. The triggering of all laser pulses 24a, 24b, 24c is thus accelerated and the laser pulses also move closer together in time.

Figure 6C:
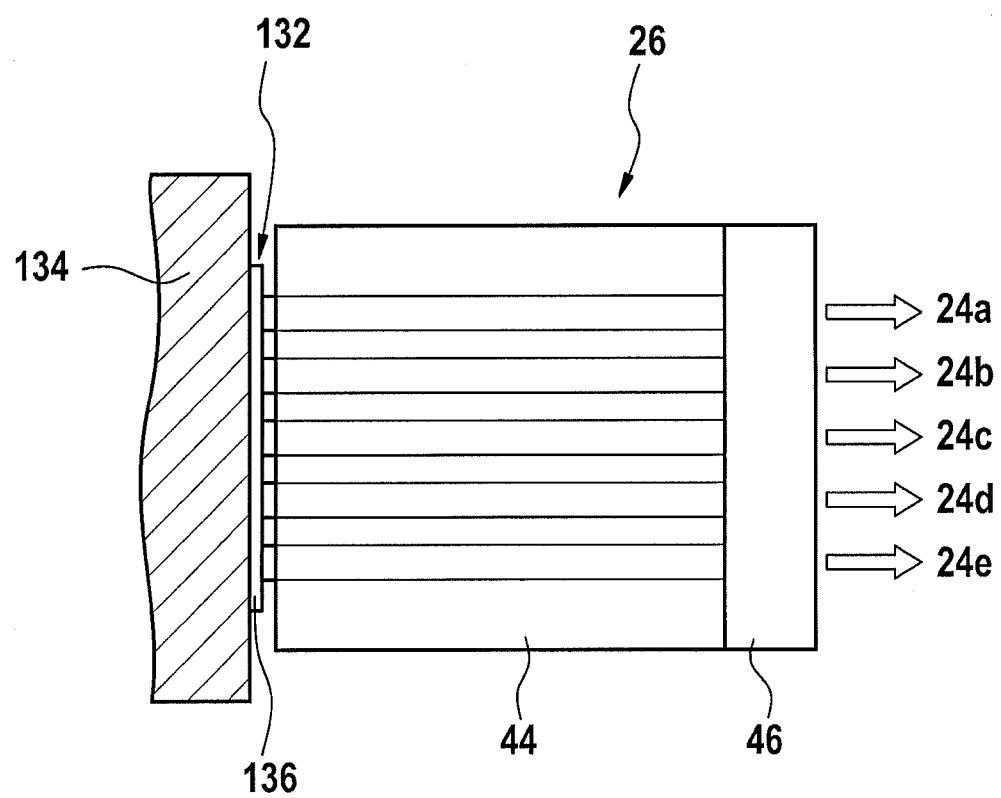

FIG. 6c shows a side view of another specific embodiment of a pump light source having multiple VCSEL arrays 132. In this specific embodiment, the individual VCSEL arrays are made sufficiently large so that they correspond in their area extension to the diameter of the mode to be pumped in solid-state laser 44. In the case of collimated emission of VCSEL arrays 132, a good overlap of pump mode and solid-state mode may be implemented. Solid-state laser 44 may advantageously be contacted with the VCSEL array, as is also apparent from FIG. 6c. Since a total of five discrete VCSEL arrays 132 are provided in the pump light source in the present case, five discrete laser pulses 24a, 24b, 24c, 24d, 24e are generated by laser device 26 upon corresponding pump light application, so that a spatial multiple ignition is implementable.

Figure 7A:
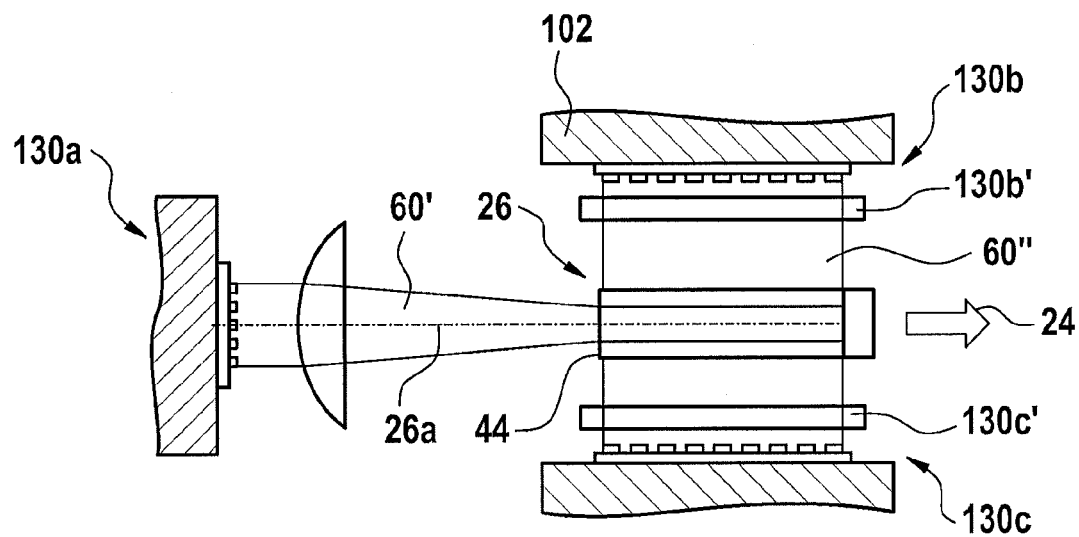
FIG. 7a schematically shows a side view of another specific embodiment.

FIG. 7a shows another specific embodiment of a laser ignition device, in which a first pump light unit 130a is provided for the longitudinal pumping of laser device 26 or laser-active solid body 44. As already described above, first pump light unit 130a has one or multiple arrays of VCSEL lasers for this purpose. A focusing optical system, which bundles pump radiation 60' onto laser device 26 or its laser active solid body 44, whereby laser-active solid body 26 is longitudinally pumped, is situated optically downstream from pump light unit 130a. In addition to first pump light unit 130a, further pump light units 130b, 130c, 130d (cf. FIG. 7b) are provided, which, in addition to the longitudinal optical pumping with the aid of pump radiation 60', also transversely pump laser device 26, namely with the aid of pump radiation 60'' generated thereby. Cylinder lenses 130b', 130c', 130d' (FIG. 7b) are each assigned to further pump light units 130b, 130c, 130d provided for the transverse optical pumping.

Pump light units 130b, 130c, 130d preferably have strip-shaped or rectangular VCSEL arrays, which extend with their longitudinal axis approximately parallel to longitudinal axis 26a (FIG. 7a) of laser device 26 and may be situated, for example, directly on an inner side of a housing 102 of laser spark plug 100 (FIG. 1).

Figure 7B:
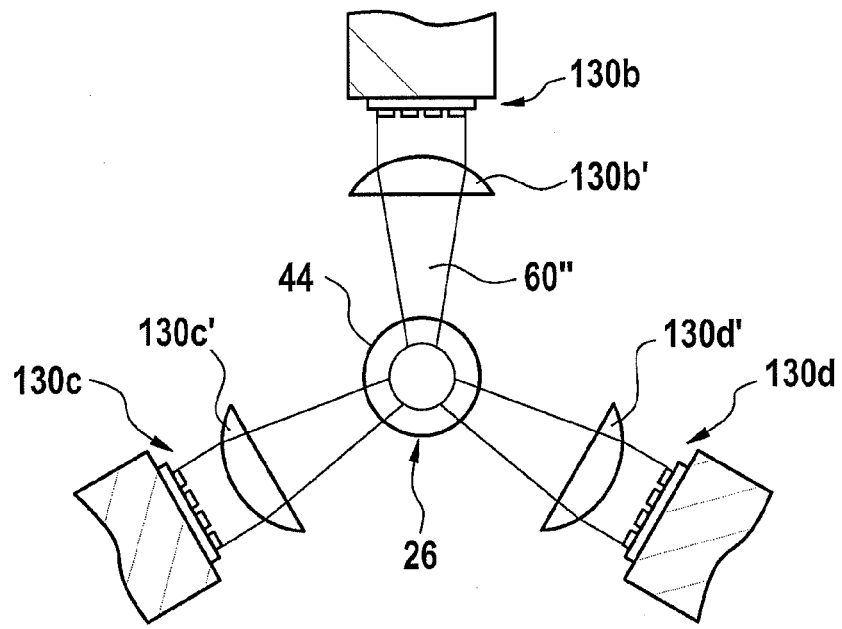

In the pump configuration shown in FIGS. 7a, 7b, comparatively low beam densities are required for the transverse pumping, since the pump power may be introduced over the entire length of absorbent material 44 and must only be weakly focused. VCSEL arrays for low power densities are particularly simple to produce, since they do not require microoptics. The shape of the oscillating mode in laser device 26 is positively influenced or determined via the longitudinal pumping with the aid of first pump light unit 130a. Therefore, a circular VCSEL array or a circular arrangement of multiple VCSEL arrays, which are imaged directly in solid-state laser 44, is preferably used for first pump light unit 130a. In this way, the shape of the oscillating mode in solid-state laser 44 may be configured significantly better than for a solely transverse pump arrangement.

The longitudinal pumping may also take place via a light-conducting fiber or a beam-shaping optical system instead of locally provided first pump light unit 130a.

Although a total of three further pump light units 130b, 130c, 130d are described above with reference to FIGS. 7a, 7b, an arbitrary number of transversely pumping pump light units may be provided. Two to six transversely pumping VCSEL arrays are particularly preferred.

The power which is not absorbed by laser device 26 during the pumping procedure may additionally be radiated back via a mirror (not shown) into solid-state laser 44.

Alternatively to the use of VCSEL arrays for transverse pump units 130b, 130c, 130d, other semiconductor lasers may also be used for this purpose, for example, edge-emitting semiconductor lasers. The mode of laser 44 may also be positively influenced by additional longitudinal pumping with the aid of a VCSEL array in such a configuration.

The above-described specific embodiments of laser-based ignition system 27 may also be combined with one another.

What is claimed is:

1. A laser ignition device for an internal combustion engine, comprising:
 a laser device, integrated directly into a laser spark plug, the laser device having a laser-active solid body and a passive Q-switch; and
 a pump light source to optically pump the laser device, the pump light source including a plurality of vertical cavity surface-emitting semiconductor lasers (VCSEL);

a light-conducting device via which pump radiation generated by the pump light source is radiated into the laser device;

wherein the light-conducting device has one of the following shapes: cone, prism, cuboid, pyramid, or cylinder, wherein the light-conducting device is at least partially formed from at least one of glass, crystalline, and ceramic material, and wherein the light-conducting device contacts at least one of the pump light source and the laser device, one of directly or with the aid of a contact medium.

2. The laser ignition device as recited in claim 1, wherein the pump light source includes a plurality of surface-emitting semiconductor lasers arranged spatially separated from one another in groups of semiconductor lasers, and pump radiation generated by the groups of semiconductor lasers is radiated one of directly or via focusing optics, into the laser device.

3. The laser ignition device as recited in claim 1, wherein the pump light source has multiple pump light units, a first pump light unit being situated and configured so that it longitudinally pumps the laser device, and at least one further pump light unit being configured and situated so that it transversely pumps the laser device.

4. The laser ignition device as recited in claim 3, wherein the pump light units provided for the transverse optical pumping each have a strip-shaped flat arrangement, which extends parallel to a longitudinal axis of the laser device.

5. The laser ignition device as recited in claim 3, wherein at least one of the pump light units, which is provided for the transverse optical pumping, is assigned a cylinder lens for bundling the pump radiation into the laser device.

6. A method for operating a laser ignition device for an internal combustion engine, the method comprising:

optically pumping a laser device of the laser ignition device using a plurality of vertical cavity surface-emitting semiconductor lasers (VCSEL), wherein the laser device is integrated directly into a laser spark plug, and wherein the laser device has a laser-active solid body and a passive Q-switch; and optically pumping, via a pump light source, the laser device, wherein the pump light source includes the plurality of the vertical cavity surface-emitting semiconductor lasers;

radiating, via a light-conducting device, pump radiation generated by the pump light source into the laser device;

wherein the light-conducting device has one of the following shapes: cone, prism, cuboid, pyramid, or cylinder, wherein the light-conducting device is at least partially formed from at least one of glass, crystalline, and ceramic material, and wherein the light-conducting device contacts at least one of the pump light source and the laser ignition device, one of directly or with the aid of a contact medium.

7. The method as recited in claim 6, wherein different volume areas of the laser device or the laser-active solid body have pump light applied to them separately.

8. The method as recited in claim 7, wherein multiple laser pulses are generated simultaneously.

9. The method as recited in claim 6, wherein the laser device is longitudinally pumped with the aid of a first pump light unit, and the laser device is transversely pumped with the aid of at least one further pump light unit.

10. The method as recited in claim 7, wherein the first pump light unit generates pump radiation having a circular beam cross section.

11. The method as recited in claim 6, wherein the pump light source includes a plurality of surface-emitting semiconductor lasers arranged spatially separated from one another in groups of semiconductor lasers, and pump radiation generated by the groups of semiconductor lasers is radiated one of directly or via focusing optics, into the laser device.

12. The method as recited in claim 6, wherein the pump light source has multiple pump light units, a first pump light unit being situated and configured so that it longitudinally pumps the laser device, and at least one further pump light unit being configured and situated so that it transversely pumps the laser device.

13. The method as recited in claim 12, wherein the pump light units provided for the transverse optical pumping each have a strip-shaped flat arrangement, which extends parallel to a longitudinal axis of the laser device.

14. The method as recited in claim 12, wherein at least one of the pump light units, which is provided for the transverse optical pumping, is assigned a cylinder lens for bundling the pump radiation into the laser device.

\* \* \* \* \*